United States Patent
Mack et al.

(10) Patent No.: US 7,046,072 B2
(45) Date of Patent: May 16, 2006

(54) COMMUTATING PHASE SELECTOR

(75) Inventors: Michael Mack, Sunnyvale, CA (US);
Manolis Terrovitis, Berkeley, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 12 days.

(21) Appl. No.: 10/837,494

(22) Filed: Apr. 30, 2004

(65) Prior Publication Data

US 2005/0195009 A1  Sep. 8, 2005

Related U.S. Application Data

(60) Provisional application No. 60/550,000, filed on Mar. 3, 2004.

(51) Int. Cl.
*H03K 17/62* (2006.01)

(52) U.S. Cl. ..................... 327/408; 370/537

(58) Field of Classification Search .............. 327/407, 327/408–413, 99; 370/532–540
See application file for complete search history.

(56) References Cited

U.S. PATENT DOCUMENTS 5,289,055 A * 2/1994 Razavi ................. 326/126
5,298,810 A * 3/1994 Scott et al. ............... 326/66
6,211,721 B1 * 4/2001 Smetana ................. 327/407
6,239,646 B1 * 5/2001 Navabi et al. ........... 327/407
6,385,214 B1 * 5/2002 Kikuchi et al. .......... 370/537
6,720,818 B1 * 4/2004 Liu et al. ................. 327/408

OTHER PUBLICATIONS

Craninckx, Jan and Michiel S. J. Steyaert "A 1.75-GHz/3-V Dual-Modulus Divide-by-128/129 Prescaler in 0.7-µm CMOS", IEEE Journal of Solid-State Circuits, vol. 31, No. 7, Jul. 1996, pp. 890-897.

* cited by examiner

*Primary Examiner*—Minh Nguyen
(74) *Attorney, Agent, or Firm*—Bever, Hoffman & Harms, LLP; Jeanette S. Harms

(57) ABSTRACT

A phase selector for selecting a differential output can include two matched transistor circuits. A first transistor circuit can receive a first differential input signal whereas a second transistor circuit can receive a second differential input signal. One of the transistor circuits can be used to dump an output current generated by the first differential input signal to Vdd. The other transistor circuit can be used to steer an output current generated by the second differential input signal to two output lines, thereby providing a differential output signal on the output lines.

8 Claims, 4 Drawing Sheets

COMMUTATING PHASE SELECTOR

RELATED APPLICATIONS

This application claims priority of U.S. Provisional Patent Application 60/550,000, entitled "System And Method For Communication" filed Mar. 3, 2004.

BACKGROUND OF THE INVENTION

1. Field of the Invention

The present invention relates to a phase selector and in particular to a commutating phase selector.

2. Description of the Related Art

Stable oscillations at different frequencies, which are needed in today's radio frequency (RF) transceivers, are typically generated using a phase-locked loop (PLL). FIG. 1 illustrates a simplified frequency synthesizer 100 that can generate different frequencies using a PLL. Specifically, in frequency synthesizer 100, a phase detector 101 can receive a reference frequency signal $F_{ref}$ and a low-frequency signal f(div). If these signals are equal in phase, then phase detector 101 would generate no output. On the other hand, if these signals are not in phase, then that difference can be converted to an output voltage.

A loop filter 102, which filters that output voltage, provides an output signal to a voltage-controlled oscillator (VCO) 103. In one embodiment, the characteristics of loop filter 102 can be selected to achieve minimum transition time between two frequencies, maximize suppression of reference sidebands in the output frequency spectrum, and minimize phase noise generated by the PLL.

VCO 103 can change its frequency based on the signal provided by loop filter 102. VCO 103 generates an output frequency $F_{out}$, which is provided to a prescaler 104. Prescaler 104 divides the output frequency $F_{out}$ by a certain ratio to generate the low-frequency signal f(div). The division ratio is typically variable to permit rapid changes in the synthesized frequency. In this embodiment of frequency synthesizer 100, an overflow bit "of", which is generated by an accumulator 105, can control the modulus of prescaler 104. Thus, the synthesized frequency can be computed using the following equation:

$$F_{out}=(N+n)\times F_{ref}$$

FIG. 2A illustrates an exemplary prescaler 104 including a dual-modulus. Specifically, in prescaler 104, a differential input signal, i.e. Fin and Fin(bar), is received by a full speed divide-by-2 block 201. The output signal of divide-by-two block 201, i.e. F2 and F2(bar), is provided to a half-speed divide-by-two block 202. For dual-modulus operation, divide-by-2 block 202 is implemented using a master-slave configuration that generates four signals: F4I, F4Q, F4I(bar), and F4Q(bar).

Frequency control block 205 generates a control signal 206 that determines the operation of phase select block 203. Specifically, if frequency control block 205 is disabled, then control signal 206 directs phase select block 203 to choose one of signals F4I, F4Q, F4I(bar), and F4Q(bar) and provide that signal to a low-speed divide-by-32 block 204. In this case, the resulting output frequency $F_{out}$ would be 2×2× 32=128 times smaller than input frequency Fin.

However, if frequency control block 205 is enabled, then control signal 206 directs phase select block 203 to choose a different phase for every positive edge of output signal $F_{out}$. Specifically, phase select block 203 will select the signal that is 90 degrees delayed with respect to the present signal. In one embodiment, F4I is initially selected and therefore is associated with 0 degrees, F4Q is then associated with 90 degrees, F4I(bar) is associated with 180 degrees, and F4Q(bar) is associated with 270 degrees. Because each subsequent signal lags the present signal by 90 degrees, signal F4 will be delayed accordingly.

FIG. 2B illustrates an exemplary phase select block 203 that includes two selection stages. In a first stage, the in-phase (I) and quadrature (Q) signals can be amplified by differential-to-single-ended amplifiers 210 and 211. Amplifiers 210 and 211 can be switched between positive and negative amplification using control signals 206A and 206B, respectively. A logic gate block 214 (in this embodiment including an inverter and NAND gates), using a control signal 206C, can determine which of the signals is actually output as signal F4. Thus, control signal 206 (FIG. 2A) can be implemented using control signals 206A, 206B, and 206C (FIG. 2B).

Notably, a sudden selection of a different signal phase may result in the creation of discontinuities in signal $F_{out}$ that can result in a miscount by a divider circuit clocked by the selected phase. A gradual shift from one phase to the next may serve to avoid this genreation of errors in a divider circuit.

Therefore, a need arises for a phase selector that can shift phases gradually rather than substantially instantaneously.

SUMMARY OF THE INVENTION

A phase selector for selecting a differential output is provided. The phase selector can include two matched transistor circuits. One of the transistor circuits can receive a first differential input signal, e.g. f4I/f4I(bar), whereas the other transistor circuit can receive a second differential input signal, e.g. f4Q/F4Q (bar).

A first transistor circuit can be used to dump an output current generated by the first differential input signal to Vdd. A second transistor circuit can be used to steer an output current generated by the second differential input signal to two output lines, thereby providing a differential output signal on the output lines.

To prevent glitches in a commutation mode, control signals provided to the transistor circuits can gradually transition from their first logic values to their second logic values. These control signals, as described below, are provided to the gates of a plurality of transistors. Thus, commutating phase selection includes gradually turning on certain transistors and turning off other transistors. Notably, the period associated with turning on the transistors is substantially equal to the period associated with turning off the transistors. Moreover, these periods span several (e.g. at least two) cycles of an input signal comprising the first and second differential input signals. Changing a polarity of the differential output signal can be done by changing two control signals provided to the second transistor circuit.

In one embodiment, each transistor circuit can include a current source connected to a first voltage source and four pairs of transistors. In the first pair of transistors, the gates receive one of the first and second differential input signals and the sources are connected to the current source. The drain of one transistor of the first pair of transistors is connected to a first node whereas the drain of the other transistor of the first pair of transistors is connected to a second node.

In the second pair of transistors, the gates receive a first control signal and the drains are connected to a second voltage source. The source of one transistor of the second pair of transistors is connected to the first node whereas the source of the other transistor of the second pair of transistors is connected to the second node.

In the third pair of transistors, the gates of the third pair of transistors receive a second control signal. The source of one transistor of the third pair of transistors is connected to the first node whereas the source of the other transistor of the third pair of transistors is connected to the second node. The drain of one transistor of the third pair of transistors is connected to one output line whereas the drain of the other transistor of the third pair of transistors is connected to the other output line.

In the fourth pair of transistors, the gates of the third pair of transistors receive a third control signal. The source of one transistor of the fourth pair of transistors is connected to the first node whereas the source of the other transistor of the fourth pair of transistors is connected to the second node. The drain of one transistor of the fourth pair of transistors is connected to one output line whereas the drain of the other transistor of the fourth pair of transistors is connected to the other output line. Note that a resistor can be connected between each output line and the first voltage source.

DETAILED DESCRIPTION OF THE FIGURES

Figure 1:
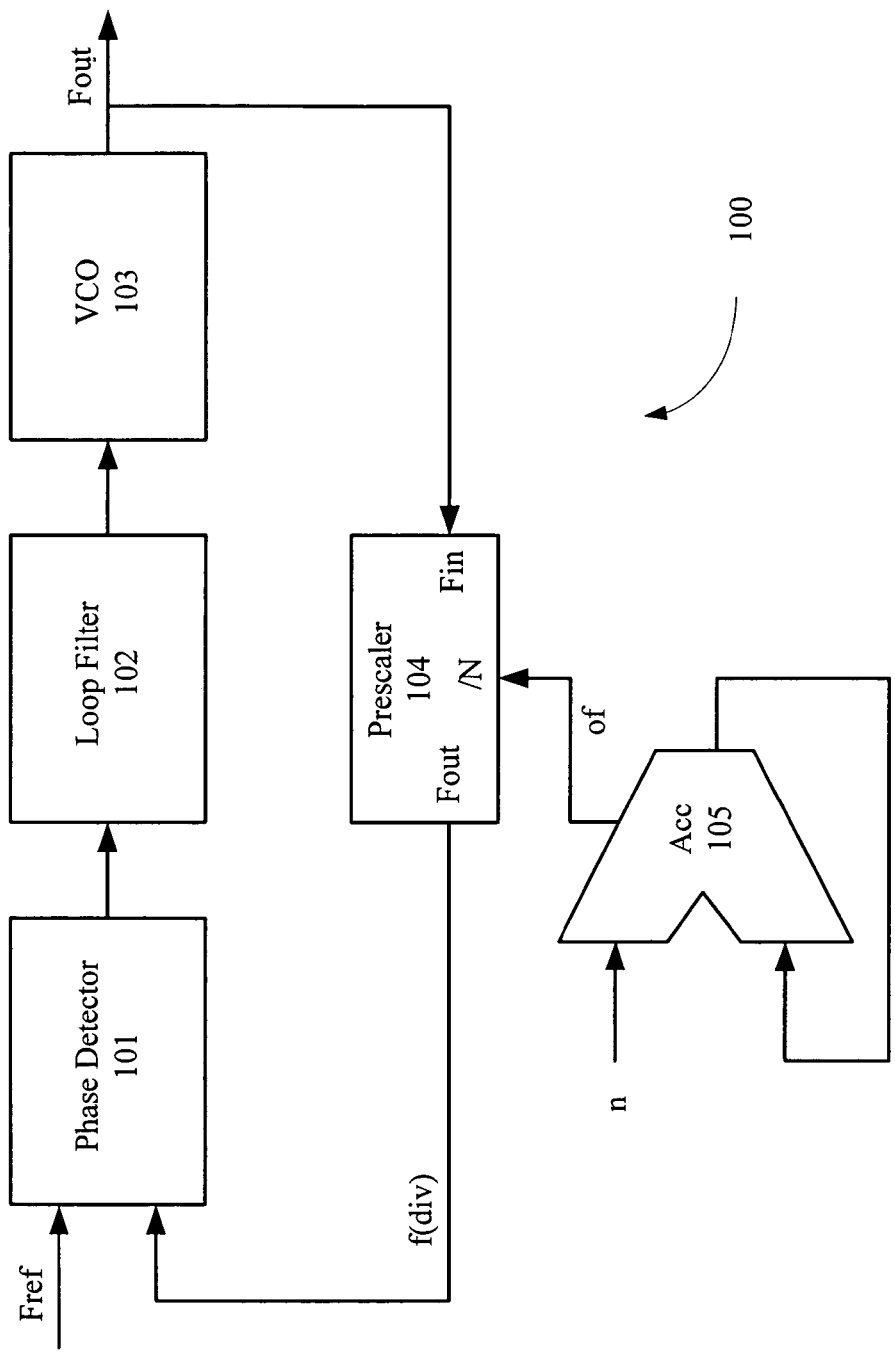
FIG. 1 illustrates a simplified frequency synthesizer including a prescaler.
Figure 2A:
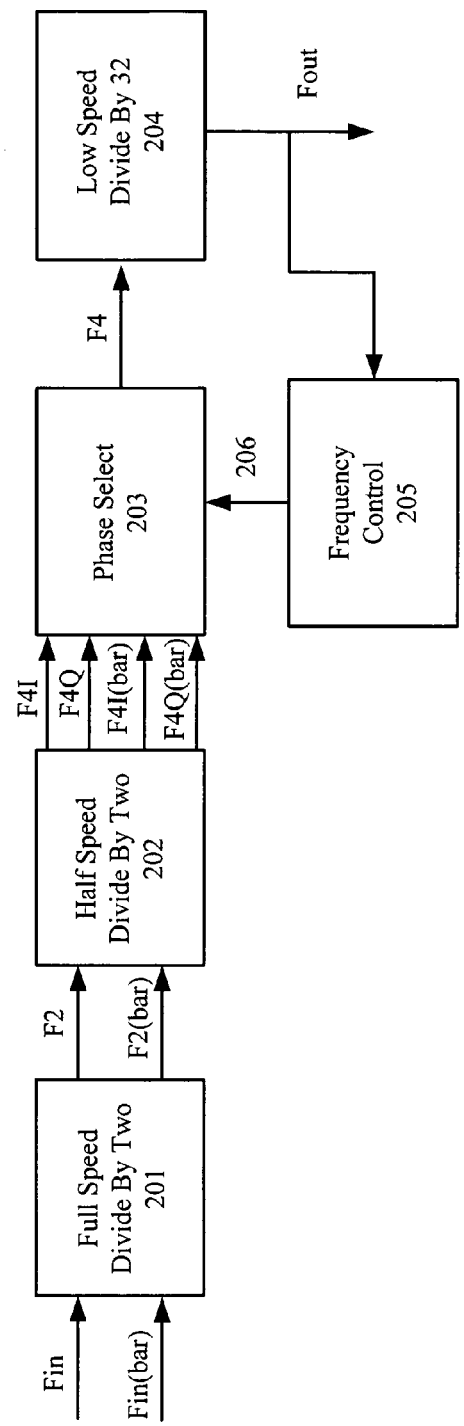
FIG. 2A illustrates an exemplary prescaler including a phase selector.
Figure 2B:
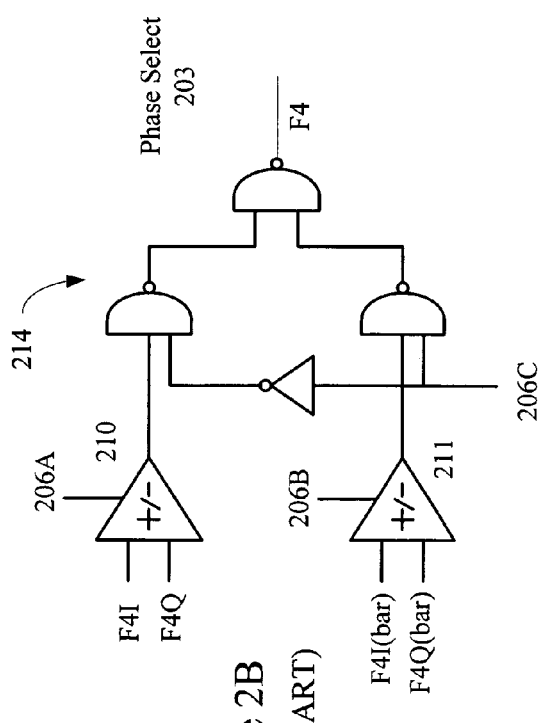
FIG. 2B illustrates a known phase selector that could be used in a prescaler.
Figure 3:
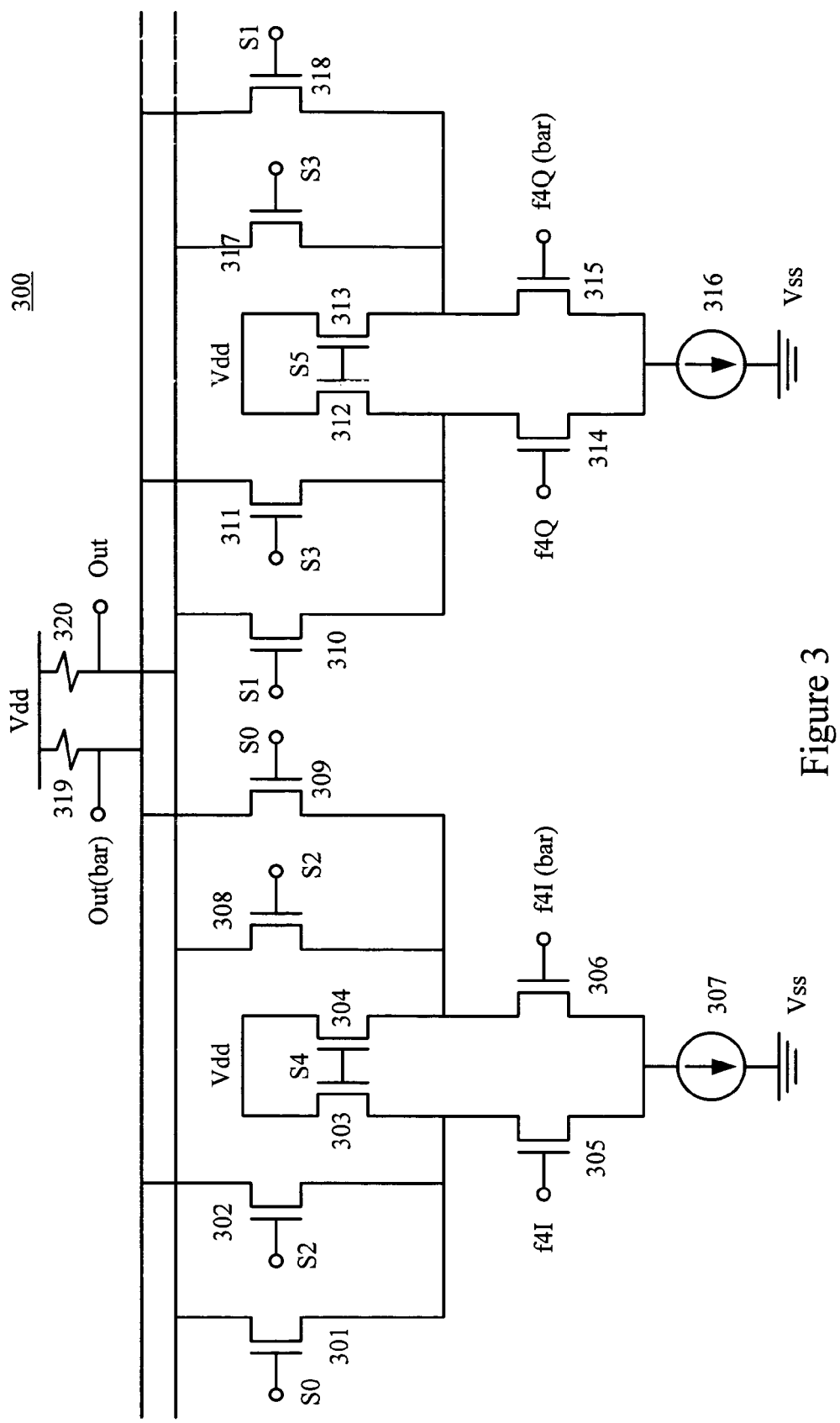
FIG. 3 illustrates an exemplary commutating phase selector.

FIG. 3 illustrates an exemplary commutating phase selector 300. In this embodiment, phase selector 300 can function as a multiplexer to select and buffer one of four input signals. These input signals can be represented differentially as V(f4I, f4I(bar)), V(f4I(bar), f4I), V(f4Q, f4Q(bar)), and V(f4Q(bar), f4Q).

Phase selection can be achieved through the low-swing differential logic phase selection control signals S0, S1, S2, S3, S4, and S5 as shown in Table 1.

TABLE 1

Output Phases and Associated Logic Signals

| Output Phase | Selected Output | Logic High | Logic Low |
|---|---|---|---|
| P0 | V(f4I, f4I(bar)) | S0, S5 | S1, S2, S3, S4 |
| P1 | V(f4Q, f4Q(bar)) | S1, S4 | S0, S2, S3, S5 |
| P2 | V(f4I(bar), f4I) | S2, S5 | S0, S1, S3, S4 |
| P3 | V(f4Q(bar), f4Q) | S3, S4 | S0, S1, S2, S5 |

As shown in FIG. 3, phase selector 300 includes a plurality of NMOS transistors 301–318 coupled to transmit a differential signal on output lines Out and Out(bar). In this embodiment, transistors 305, 306, 314, and 315 receive signals f4I, f4I(bar), f4Q, f4Q(bar), respectively, on their gates.

Transistors 303 and 305 are connected in series between a high (more positive) voltage source Vdd and a current source 307. Similarly, transistors 304 and 306 are connected in series between the high voltage source Vdd and a current source 307 (which in turn is connected to a low voltage source Vss). Transistor 301 is connected between output line Out and a drain of transistor 305 (and a source of transistor 303) (also called a node herein). Transistor 302 is connected between output line Out(bar) and the drain of transistor 305. Transistor 308 is connected between output line Out and a drain of transistor 306 (and a source of transistor 304) (also called a node herein). Transistor 309 is connected between output line Out(bar) and the drain of transistor 306. Transistors 301 and 309 are controlled by control signal S0, transistors 302 and 308 are controlled by control signal S2, and transistors 303 and 304 are controlled by control signal S4. Note that resistors 320 and 319 are connected between output lines Out and Out(bar) and high voltage source Vdd.

Transistors 312 and 314 are connected in series between a high voltage source Vdd and a current source 316. Similarly, transistors 313 and 315 are connected in series between the high voltage source Vdd and current source 316 (which in turn is connected to a low voltage source Vss). Transistor 310 is connected between output line Out and a drain of transistor 314 (and a source of transistor 312). Transistor 311 is connected between output line Out(bar) and the drain of transistor 314. Transistor 317 is connected between output line Out and a drain of transistor 315 (and a source of transistor 313). Transistor 318 is connected between output line Out(bar) and the drain of transistor 315. Transistors 310 and 318 are controlled by control signal S1, transistors 311 and 317 are controlled by control signal S3, and transistors 312 and 313 are controlled by control signal S5.

In this configuration, phase selector 300 essentially includes two transistor circuits. Specifically, phase selector 300 includes a first transistor circuit for receiving a first differential input signal f4I/f4I(bar) and a second transistor circuit for receiving a second differential input signal f4Q/f4Q(bar).

Notably, the first and second transistor circuits are matched. For example, the first transistor circuit including current source 307 and transistors 301, 302, 303, 304, 308, and 309 matches the second transistor circuit includes current source 316 and transistors 310, 311, 312, 313, 317, and 318. This matching facilitates forming phase selector 300 in layouts using step or mirror symmetry. Such matching also promotes signal symmetry, which may serve to minimize spurious signals (spurs) in a synthesizer.

A phase can be selected by selecting the appropriate control signals S0–S5. For example, for phase P3 to be provided, control signals S3 and S4 can be set to a logic high value whereas control signals S0, S1, S2, and S5 can be set to a logic low value. In this case, transistors 303, 304, 311, and 317 are conducting and all other transistors in phase selector 300 are not conducting.

Thus, the transistor circuit including transistors 303 and 304 (which are activated by control signal S4) can be used to dump an output current generated by differential input signal f4I/f4I(bar) to Vdd. In contrast, the transistor circuit including transistors 311 and 317 (which are activated by control signal S3) can be used to steer an output current generated by differential input signal f4Q/f4Q(bar) to output lines Out and Out(bar), thereby providing the desired differential output signal to those output lines. Specifically, the differential signal V(f4Q(bar), f4Q) can be provided on output lines Out and Out(bar), respectively.

Other phases can be provided using the appropriate control signals as shown in Table 1. Note that changing two control signals can reverse the polarity of the differential output signal. For example, to change from V(f4I, f4I(bar)) to V(f4I(bar), f4I), the logic values of control signals S0 and S2 can be switched. Similarly, to change from V(f4Q, f4Q(bar)) to V(f4Q(bar), f4Q), the logic values of control signals S1 and S3 can be switched.

Phase selector 300 can support at least two modes: a phase commutation mode and a static mode. In the phase commutation mode, each of the four possible outputs is selected continuously as in the following sequence: P0, P1, P2, P3, P0, P1, P2, P3, P0, . . . In one embodiment, a phase selection state machine can drive the phase selection inputs (i.e. signals S0–S5) as required to achieve the sequence of output phases. In the static mode, only one phase is selected. In this case, the phase selection state machine can stop commutating and the phase selection inputs would remain in a specific state according to Table 1.

Figure 4:
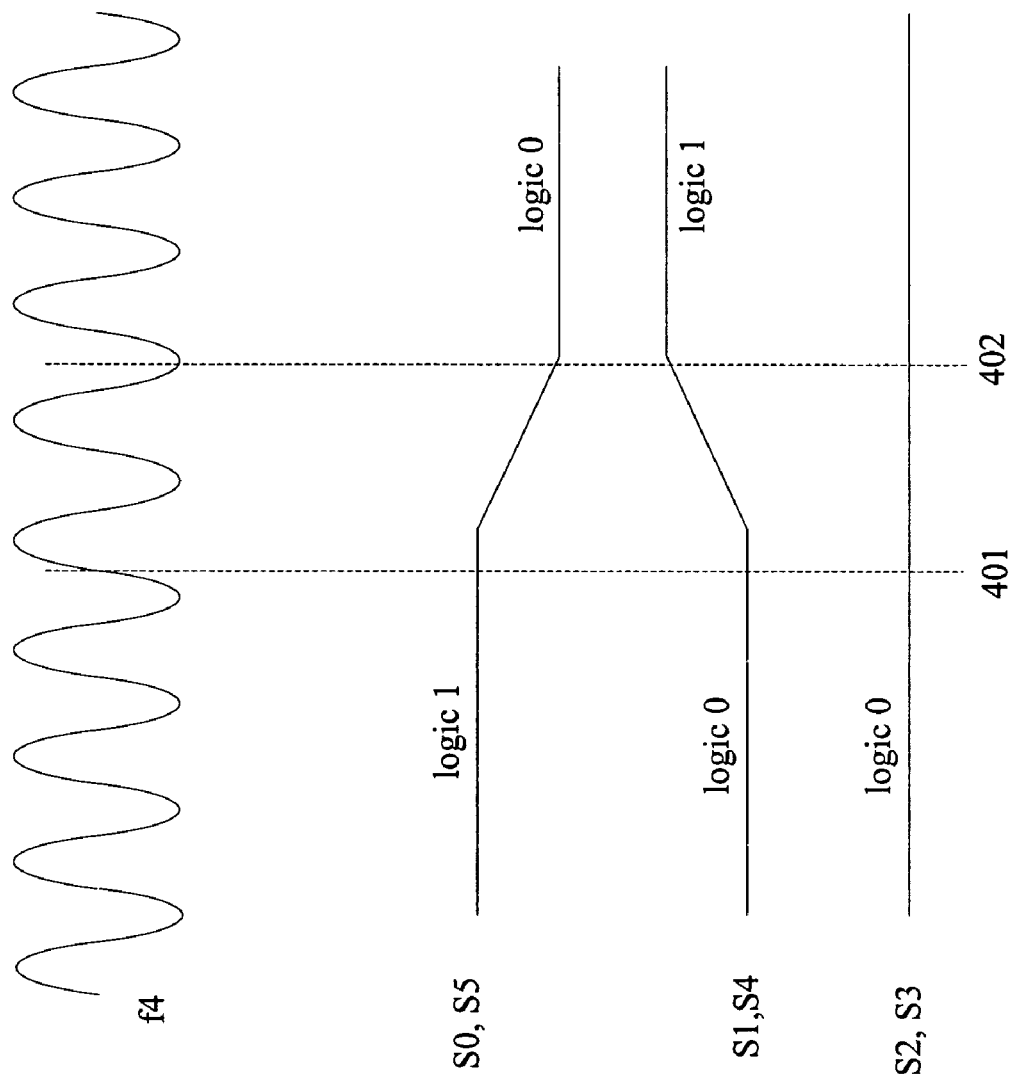
FIG. 4 illustrates a timing diagram showing a gradual commutation from one phase to another.

Notably, in the phase commutation mode, glitches can be prevented by blending the input phases continuously to produce a glitch-free signal at the output. Specifically, blending can be done by intentionally decreasing the phase selection gain and gradually changing the phase selection signals S0–S5, as appropriate, over several cycles of the input signal (i.e. input signal f4). In accordance with one aspect of the invention, the phase selector can interpolate between adjacent input signals as the phase selection signals change. For example, FIG. 4 illustrates a timing diagram 400 showing a gradual commutation from phase P0 (signals S0 and S5 having a logic high value) to phase P1 (signals S1 and S4 having a logic high value). Advantageously, this blending can prevent glitches from occurring.

In one embodiment, a computer-implementable software program for operating a phase selector can be provided. This software program can include instructions for determining the appropriate control signals, instructions for using one transistor circuit to dump an output current generated by a first differential input signal to Vdd, and instructions for using the other transistor circuit to steer an output current generated by a second differential input signal to output lines of the phase selector, thereby providing a differential output signal to the output lines. In another embodiment, the phase selector may be operated by a state machine.

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

For example, in other embodiments, a phase selector can be implemented using a 4:1 multiplexer, e.g. as a cascade of three 2:1 multiplexers. However, note that phase selector 300 can advantageously consume less power and have better phase matching properties than a 4:1 multiplexer implemented as a cascade of 2:1 multiplexers.

Note that the current sources, resistors, and NMOS transistors can be sized according to the desired range of frequencies and/or the process used to fabricate the phase selector. For example, in one embodiment, current sources 307 and 316 could provide 100–1000 μamps, resistors 319 and 320 could provide 100–5000 Ohms, the NMOS transistors receiving the differential input signals (i.e. transistors 305, 306, 314, and 315) could have a minimum length (thereby facilitating maximum speed), and the remaining NMOS transistors (i.e. the transistors receiving control signals S1–S5) could be sized to increase the Vgs (gate-to-source voltage)-Vt (threshold voltage) (to facilitate the blending of the currents).

Accordingly, it is intended that the scope of the invention be defined by the following claims and their equivalents.

What is claimed is:

1. A phase selector for selecting a differential output, the phase selector comprising:
   a first transistor circuit for receiving a first differential input signal;
   a second transistor circuit for receiving a second differential input signal; and
   a pair of output lines connected to the first and second transistor circuits, wherein the output lines provide the differential output, and wherein the first and second transistor circuits are substantially matched, wherein each transistor circuit includes:
   a current source connected to a first voltage source;
   a first pair of transistors, wherein gates of the first pair of transistors receive one of the first and second differential input signals, sources of the first pair of transistors are connected to the current source, a drain of one transistor of the first pair of transistors is connected to a first node, and a drain of another transistor of the first pair of transistors is connected to a second node;
   a second pair of transistors, wherein gates of the second pair of transistors receive a first control signal, drains of the second pair of transistors are connected to a second voltage source, a source of one transistor of the second pair of transistors is connected to the first node, and a source of another transistor of the second pair of transistors is connected to the second node;
   a third pair of transistors, wherein gates of the third pair of transistors receive a second control signal, a source of one transistor of the third pair of transistors is connected to the first node, a source of another transistor of the third pair of transistors is connected to the second node, a drain of one transistor of the third pair of transistors is connected to one of the pair of output lines, and a drain of another transistor of the third pair of transistors is connected to another of the pair of output lines; and
   a fourth pair of transistors, wherein gates of the fourth pair of transistors receive a third control signal, a source of one transistor of the fourth pair of transistors is connected to the first node, a source of another transistor of the fourth pair of transistors is connected to the second node, a drain of one transistor of the fourth pair of transistors is connected to one of the pair of output lines, and a drain of another transistor of the fourth pair of transistors is connected to another of the pair of output lines.

2. The phase selector of claim 1, wherein each transistor is an NMOS transistor.

3. The phase selector of claim 1, further including a resistor connected between each output line and the second voltage source.

4. A method of operating a phase selector including a first transistor circuit and a second transistor circuit, the method comprising:
   determining control signals for the first and second transistor circuits;
   using the first transistor circuit to dump an output current generated by a first differential input signal to vdd;
   using the second transistor circuit to steer an output current generated by a second differential input signal to output lines, thereby providing a differential output signal to the output lines; and changing a polarity of the differential output signal by changing two control signals of the second transistor circuit.

5. A method of designing a phase selector, the method comprising:

providing a first transistor circuit for receiving a first differential input signal;

providing a second transistor circuit for receiving a second differential input signal; and providing a pair of output lines selectively connected to the first and second transistor circuits, wherein the output lines provide a differential output, and wherein the first and second transistor circuits are matched, further including for each transistor circuit:

providing a current source connected to a first voltage source;

providing a first pair of transistors, wherein gates of the first pair of transistors receive one of the first and second differential input signals, sources of the first pair of transistors are connected to the current source, a drain of one transistor of the first pair of transistors is connected to a first node, and a drain of another transistor of the first pair of transistors is connected to a second node;

providing a second pair of transistors, wherein gates of the second pair of transistors receive a first control signal, drains of the second pair of transistors are connected to a second voltage source, a source of one transistor of the second pair of transistors is connected to the first node, and a source of another transistor of the second pair of transistors is connected to the second node;

providing a third pair of transistors, wherein gates of the third pair of transistors receive a second control signal, a source of one transistor of the third pair of transistors is connected to the first node, a source of another transistor of the third pair of transistors is connected to the second node, a drain of one transistor of the third pair of transistors is connected to one of the pair of output lines, and a drain of another transistor of the third pair of transistors is connected to another of the pair of output lines; and providing a fourth pair of transistors, wherein gates of the fourth pair of transistors receive a third control signal, a source of one transistor of the fourth pair of transistors is connected to the first node, a source of another transistor of the fourth pair of transistors is connected to the second node, a drain of one transistor of the fourth pair of transistors is connected to one of the pair of output lines, and a drain of another transistor of the fourth pair of transistors is connected to another of the pair of output lines.

6. The method of claim 5, wherein each transistor is designated an NMOS transistor.

7. The method of claim 6, further including providing a resistor connected between each output line and the second voltage source.

8. A phase selector comprising:

means for selectively dumping an output current generated by a first differential input signal to Vdd;

means for selectively steering an output current generated by a second differential input signal to output lines of the phase selector, thereby providing a differential output signal to the output lines; and means for changing a polarity of the differential output signal by changing control signals provided to the means for selectively steering.

* * * * *